United States Patent
Scheffer et al.

(10) Patent No.: US 7,814,447 B2
(45) Date of Patent: Oct. 12, 2010

(54) SUPPLANT DESIGN RULES IN ELECTRONIC DESIGNS

(75) Inventors: Louis K. Scheffer, Campbell, CA (US); David White, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 204 days.

(21) Appl. No.: 11/866,370

(22) Filed: Oct. 2, 2007

(65) Prior Publication Data

US 2008/0163141 A1 Jul. 3, 2008

Related U.S. Application Data

(60) Provisional application No. 60/877,999, filed on Dec. 29, 2006.

(51) Int. Cl.
*G06F 17/50* (2006.01)
(52) U.S. Cl. .................... 716/5; 716/2; 716/19
(58) Field of Classification Search .............. 716/2–5, 716/19–21
See application file for complete search history.

(56) References Cited

U.S. PATENT DOCUMENTS

| | | | |
|---|---|---|---|
| 7,062,741 B1 * | 6/2006 | Leng et al. ............ 716/11 |
| 7,124,386 B2 | 10/2006 | Smith et al. |
| 7,152,215 B2 | 12/2006 | Smith et al. |
| 7,174,520 B2 | 2/2007 | White et al. |
| 7,243,316 B2 | 7/2007 | White et al. |
| 7,325,206 B2 | 1/2008 | White et al. |
| 7,353,475 B2 | 4/2008 | White et al. |
| 7,356,783 B2 | 4/2008 | Smith et al. |
| 7,360,179 B2 | 4/2008 | Smith et al. |
| 7,363,099 B2 | 4/2008 | Smith et al. |
| 7,363,598 B2 | 4/2008 | Smith et al. |
| 7,367,008 B2 | 4/2008 | White et al. |
| 7,380,220 B2 | 5/2008 | Smith et al. |
| 7,383,521 B2 | 6/2008 | Smith et al. |
| 7,393,755 B2 | 7/2008 | Smith et al. |
| 2005/0037522 A1 | 2/2005 | Smith et al. |
| 2005/0051809 A1 | 3/2005 | Smith et al. |
| 2005/0132306 A1 * | 6/2005 | Smith et al. .............. 716/1 |
| 2005/0188338 A1 * | 8/2005 | Kroyan et al. ............ 716/9 |
| 2005/0196964 A1 | 9/2005 | Smith et al. |
| 2005/0235246 A1 | 10/2005 | Smith et al. |
| 2007/0101305 A1 | 5/2007 | Smith et al. |
| 2007/0256039 A1 | 11/2007 | White |
| 2008/0027698 A1 | 1/2008 | White |
| 2008/0160646 A1 | 7/2008 | White et al. |

(Continued)

*Primary Examiner*—Paul Dinh
(74) *Attorney, Agent, or Firm*—Vista IP Law Group LLP (57) ABSTRACT

Disclosed is an improved method, system, and computer program product for electronic designs with supplant design rules. According to some embodiments of the invention, the foundry-imposed design rules are replaced by one or more supplant design requirements which define absolute or relative threshold(s) for a design feature characteristic. Some other embodiments of the invention, the foundry-imposed design rules are replaced by one or more supplant design requirements which define one or more ranges of absolute or relative values for a design feature characteristic. Some other embodiments of the invention further provide an EDA tool which takes into account a model for the electronic design, the processing, metrological, lithographic, or imaging processing processes or techniques, and the supplant design requirements to determine whether the features of an electronic design meet the design requirements.

32 Claims, 8 Drawing Sheets

U.S. PATENT DOCUMENTS

| | | |
|---|---|---|
| 2008/0162103 A1 | 7/2008 | White et al. |
| 2008/0163139 A1 | 7/2008 | Scheffer et al. |
| 2008/0163141 A1 | 7/2008 | Scheffer et al. |
| 2008/0163142 A1 | 7/2008 | White et al. |
| 2008/0163148 A1 | 7/2008 | Scheffer et al. |
| 2008/0163150 A1 | 7/2008 | White et al. |
| 2008/0216027 A1 | 9/2008 | White et al. |
| 2009/0031261 A1 | 1/2009 | Smith et al. |
| 2009/0031271 A1 | 1/2009 | White et al. |

* cited by examiner

SUPPLANT DESIGN RULES IN ELECTRONIC DESIGNS

CROSS-REFERENCE TO RELATED APPLICATION(S)

This application claims the benefit of U.S. Provisional Application No. 60/877,999, filed on Dec. 29, 2006, which is hereby incorporated by reference in its entirety.

BACKGROUND OF THE INVENTION

The main goal of computer-aided design simulations is the device electrical characteristics. The device dimensions which have significant impact on the electrical characteristics include, for example, gate oxide thickness, gate width, and length, shape of the poly gate at the bottom, and spacer width. Semiconductor fabrication techniques have advanced so much as to create fairly simple geometrical shapes for these features. As a result, simple geometrical etch rules have been sufficient for these critical dimensions of the device. As device dimensions continue to shrink, semiconductor fabrication processes or techniques require more complex techniques to meet the design goals. In one particular area, the topography on the wafer created by various fabrication processes has become increasingly important.

As the device size shrinks, especially into the deep-submicron regime, the electric properties of wires become more prominent, and chips are more susceptive to breakdown during fabrication due to, for example, antenna effect or to wear out over time due to, for example, electro-migration. Some prior methods proposed prioritizing the nets and forcing shorter wire lengths among the high-priority, timing critical nets. However, making certain wires shorter usually comes at the expense of making other wires longer. Some other prior methods use larger gates with bigger transistors and higher drive strengths to charge the capacitance of wire more quickly and therefore making the path faster to maintain timing correctness without overly shortening some wires while lengthening others. However, one problem exists for these methods. In electronic designs, the actual wire lengths are not known until some gates are physically in place. Nonetheless, because larger gates also have larger capacitance and thus increases both timing delay and power dissipated, the above solution does not satisfactorily solve the problems caused by increasingly shrinking feature sizes.

Another problem with using larger gates is that larger gates with larger drive strength tend to worsen the problem of electro-migration. Deposited aluminum and copper interconnect have a polycrystalline structure from most fabrication processes; that is, these aluminum and copper interconnects are made of small grain lattices. Metal atoms can be transported between the grain boundaries. Electro-migration occurs during the momentum exchange between the mobile carriers and the atomic lattice as the current flow through the interconnect. As a result of the momentum exchange, metal tends to deposit in the direction of the electron flow, and voids thus form at the grain boundaries and reduce the conductivity. Such voids may over time cause the interconnect to stop conducting electricity altogether and thus cause the interconnect to fail.

Moreover, the continual effort to scale down to the deep submicron region requires multilevel interconnection architecture to minimize the time delay due to parasitic resistance and capacitance. As the devices shrinks smaller, the delay caused by the increased R-C time constant becomes more significant over the delay caused by the actual wire length. In order to reduce the R-C time constant, interconnect materials with low resistivity and interlayer films with low capacitance are required. However, the use of low-k dielectric material aggravates the electro-migration problem due to the poor thermal conductivity of these low-k dielectric materials.

Figure 1:
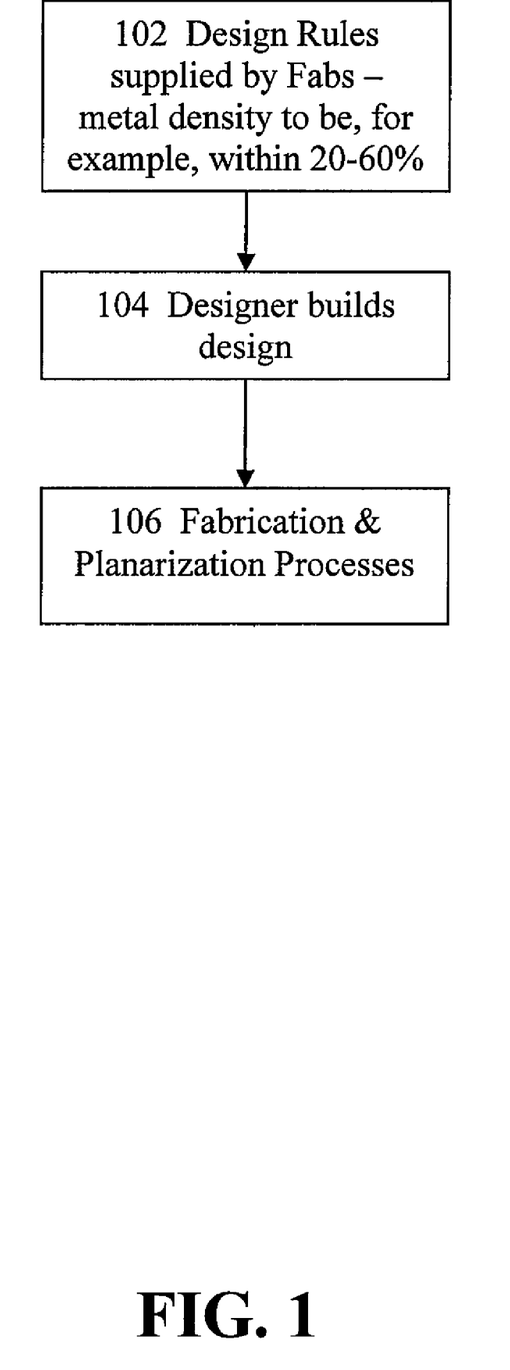
FIG. 1 illustrates a general flow of a methodology for foundry-imposed design rules.

One way of resolving the aforementioned problems introduced by the continual reduction in feature sizes is to impose certain density rules for metal filling. Such rules typically comprise certain maximum and minimum densities within certain windows on the chip. Some other rules impose different density limits among different window areas. FIG. 1 illustrates an example of such design rules involving percentages of metal densities. At step 102, the designer receives a set of foundry-imposed design rules which specify the minimum and maximum of metal densities in a window of certain size. It shall be noted that the design rule requiring metal density be within 20-60% in 102 merely represents an example for illustrative purposes.

At 104, designer builds the design based upon the foundry-imposed design rules. The designer then sends the design to fabrication and hopes that the design would work as designed, 106. However, such rules typically assume that the thickness of the wire is constant according to certain formulae and therefore manipulate only the width of the wires to achieve the design goals. Although this assumption arises out of a practical consideration, such an assumption appears to be outdated, especially in light of the current development in incorporating the topological variations of each film into the electronic designs and the continuously shrinkage in sizes of device features. Moreover, wire width cannot be arbitrarily changed due to the polycrystalline structure of the interconnect materials. As a result, additional methods have been developed to slot certain wires such that the metal density within certain region falls within the prescribed maximum and minimum limits.

Nonetheless, the above rule-based methods pose new problems. For instance, a good interconnect may be wrongfully determined to be improper for failing to meet the density rules or for producing unacceptable R-C delay even though the interconnect actually satisfies the design goals or design intent by having certain thickness that is different from the assumed value. A contrary example is that a bad interconnect may also be wrongfully determined to be proper for meeting the metal density rules and/or the delay requirement. As a result, there exists a need for a more accurate and effective method for supplanting the above rule-based design criteria and replacing these methods with a new and improved method which takes into account the topographical variation of the films and a new set of rules incorporating thicknesses of the films or other characteristics of the features of a feature in an electronic design.

Moreover, chemical mechanical polishing (CMP) is an important planarization technique for integrated circuit manufacturing. Conventionally, in order for CMP to work properly, the layout must be made uniform with respect to certain density parameters. As a result, foundries typically impose metal density requirements as mandatory design rules that must be satisfied prior to tapeout. Such design rules may be one that requires, for example, the metal density be within 20-60% within an arbitrarily placed square area of certain size. Such design rules exhibit, however, several disadvantages in the sense that they may outlaw some perfectly good designs in some cases and legalize some bad designs in others. Furthermore, even among legal designs which are within such limits, designers may nonetheless prefer different metal thicknesses in different parts of their designs.

For example, a designer might prefer thin metal where minimum capacitance (C) is needed, and thick metal where minimum resistance (R) is required. A density limit, as typically specified by the foundries now, does not tell how the thickness depends on density and does not express any relationship between density and thickness, not even the sign of any such relationship. Moreover, with the introduction of dual-damascene processes, the combination of electroplating (or electrochemical deposition, ECD) and CMP processes which are applied to create multi-material interconnect create even more complex pattern dependencies that include features such as line width and line perimeter. For example, an array of 0.12 micron copper lines at 50% density may not polish to the same topographical profile as an array of one micron copper lines at 50% density.

The elimination of etch stops also created more complex pattern and process interaction that results in variation in the bottom of the etched interconnect features, particularly with regard to linewidth geometries. Thickness may be impacted by variation on the top of the surface as a result of CMP, such as the topology of the layer processed by CMP, or in the bottom of certain etched features.

SUMMARY OF THE INVENTION

As such, there exists a need for a method, a system, and a computer program product to more realistically capture the actual fabrication requirements and to supplant the indirect and oftentimes ineffective metal density requirement imposed by the foundries. For some process flows, this need may require one or more models for CMP, electro-plating or electrochemical deposition, wet or dry etching, or some combination thereof to characterize the required systematic variations and to predict pattern related thickness variations. Moreover, concurrent models for other processes or techniques such as physical vapor deposition (PVD), chemical vapor deposition (CVD), atomic layer deposition (ALD), electrochemical deposition or electroplating (ECD), electroless plating or deposition, auto-catalytic plating or deposition, molecular beam epitaxy (MBE), ion implantation, thermal processing, oxidation, annealing (diffusion and dopant activation), wet etching, dry etching, chemical mechanical polishing (CMP), or reflow may also be required to characterize the variation of the features of an electronic circuit and to predict the resulting pattern related thickness variations.

DESCRIPTION OF FIGURES

The drawings illustrate the design and utility of various embodiments of the invention. It should be noted that the figures are not drawn to scale and that elements of similar structures or functions are represented by like reference numerals throughout the figures. In order to better appreciate how the above-recited and other advantages and objects of various embodiments of the present inventions are obtained, a more particular description of various embodiments of the present inventions briefly described above will be rendered by reference to specific embodiments thereof, which are illustrated in the accompanying drawings. Understanding that these drawings depict only exemplary embodiments of the invention and are not therefore to be considered limiting of its scope, various embodiments of the invention will be described and explained with additional specificity and details through the use of the accompanying drawings in which.

DETAILED DESCRIPTION

Various embodiments of the present invention are directed to an improved method, system, and computer program product for performing floorplanning, layout, placement, routing, and post-wiring optimization for electronic designs. As noted above, conventional methods and systems merely define some upper and lower thresholds for metal densities and manipulate the wire widths and metal fill to determine whether the metal density rules are satisfied.

Various embodiments of the invention may be implemented in numerous ways, including as software, hardware (e.g., circuitry), a process, an apparatus, a system, a method, or as a set of instructions on a computer readable medium such as a computer readable storage medium or one or more storage devices on a computer network wherein program instructions are sent over optical or electronic communication links. In general, the actions of disclosed processes may be performed in an arbitrary order, unless otherwise provided in the claims.

A detailed description of one or more examples is provided below along with accompanying figures. The detailed description is provided in connection with such examples, but is not limited to any particular examples. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the examples has not been described in detail to avoid unnecessarily obscuring the description.

Various embodiments of the present invention is directed to an improved method, system, and computer program product for performing floorplanning, layout, placement, and/or routing for electronic designs. According to some embodiments of the present invention, the rule-based foundry imposed design rule is replaced by a new rule which specifies a characteristic of a feature of the electronic design as to be manufactured on a wafer or a board, of a plurality of features within an area of the electronic design as to be manufactured on a wafer or a board, of one or more features of the electronic design across the entire wafer or the entire board, or of one or more features of the electronic design from one wafer to another or from one board to another, to be no thinner than a lower threshold and/or no thicker than an upper threshold or to be within a predetermined range of values for the characteristic.

Such characteristics may be geometric, geometric coupled with physical, chemical, and/or electrical attributes of the material of the feature, or purely physical, chemical, and/or electrical. For example, such characteristics may comprise, but shall not be limited to, size(s), dimension(s), or topological profile(s) of a design feature, resistivity, resistance, capacitance, or R-C time constant of a design feature as to be manufactured on a wafer or a board, uniformity, or dopant density of a design feature within a wafer or a board or from one wafer or board to another wafer or board. In the above examples of characteristics, the size(s), dimension(s), and topological profile(s) of a design feature as to be manufactured on a wafer or a board may be categorized as geometric, while the characteristic of resistivity, resistance, capacitance, inductance, R-C time constant, or propagation delay of a design feature as to be manufactured on a wafer or a board may be deemed as geometric coupled with electrical attributes of the materials of the design feature, and the characteristic of dopant density of a design feature may be categorizes as purely physical, chemical, or electrical.

In accordance with the design intent and/or the fabrication requirements, the new rule may be defined to specify, in some embodiments of the present invention, the thickness of a certain semiconductor film to be, for example but shall not be limited to, no thinner than 90 nm and/or no thicker than 150 nm. In these embodiments, this characteristic under the new rule may be categorized as geometric as only a geometric dimension (i.e., the thickness of the film) is specified under the new rule. The new rule may, in other embodiments, specify another characteristic of a feature in one area of the electronic design to be within one or more ranges of absolute and/or relative values or a combination thereof. For example, the new rule may specify, in some other embodiments of the present invention, the variation of the film thickness to be no greater than 60 nm or to be no greater than 40% of the minimum thickness.

In some other embodiments of the present invention, the new rule need not specify any upper and/or lower thresholds or any ranges of absolute and/or relative values for any particular features of the electronic circuit. Rather the new rule may specify the actual requirement for a characteristic of the electronic design. For example, the new rule may specify the flatness of the top surface of a certain film within a certain area in the electronic design to be within 5 nm, or the RC time constant to be no greater than a certain value. Here, in these embodiments, the characteristic of the design feature under the new rule may be deemed geometric in the former (flatness) or geometric coupled with electrical (RC time constant). Where the rule specifies the actual requirement for a characteristic of the electronic design, the method or the system may further require the incorporation and analyses of one or more models of the fabrication processing, metrological, lithographic, or imaging processing (such as resolution enhancement techniques (RET)) processes or techniques. Moreover, some of the one or more models of the fabrication processing, metrological, lithographic, or imaging processes or techniques may be tool- or technique-dependent and may thus be constructed and/or calibrated by using the information obtained from a patterned test wafer or from other sources of limited fidelity such as a simple analytic model, empirical formulae or models, formulae or models with interpolation or extrapolation of information or data, or other approximations.

In some other embodiments of the present invention, a user may analyze the semiconductor processing models to predict feature sizes, such as thicknesses, of various features of the electronic design and then modify the feature sizes based in part upon the predicted feature sizes from the semiconductor processing model analyses so as to meet the requirement. Some other embodiments of the present invention define one or more design requirements that do not specify the minimum and maximum thresholds of metal thicknesses or other feature sizes and use one or more of these requirements to evaluate which features of the layout should be modified and which features are manufacturable.

Some other embodiments of the invention provide an electronic design automation tool that take an electronic design layout, a CMP and/or an Etch model, concurrent models for other processes or techniques, and one or more requirements which are based upon the upper and/or lower thresholds or one or more ranges of certain feature characteristics (such as metal thicknesses) to show to the users where, within the electronic design, these requirements are not satisfied. The user may or the electronic design automation tool may then decide where and how to modify these features based upon one or more provided violations of the requirements, the design intent, and/or other design requirements. These modifications may include changes to the placement or geometries related to the routing of interconnect, configuration of vias, or placement of IP within the design.

Some other embodiments of the present invention provide an electronic design automation tool which takes a design layout, a planarization model, other semiconductor processing models, and one or more requirements which are based upon the upper and lower threshold of feature sizes (such as metal thicknesses) to recommend changes to the user based upon the violations of the aforementioned requirements.

Some other embodiments provide an electronic design automation tool that communicates to the designer, or other CAD tool, the expected thicknesses of the features, so the designer can try to improve the circuit performance while remaining within the legal values. See U.S. Provisional Application entitled "Methods and System for Timing Closure in Electronic Designs" under provisional application Ser. No. 60/878,008, filed concurrently herewith.

Some other embodiments of the present invention generate model based abstractions derived from more advanced or comprehensive models or simulations. These abstractions may be used to provide faster computation of process related variations for applications where more advanced models may not meet the computational requirements. In some cases, more advanced simulations based on physical or chemical derivations may be abstracted using various data fitting algorithms such as some empirical data fitting algorithms (e.g. neural networks, linear or non-linear regression) of the model transformation or a simplified approximation using multi-dimensional convolution of layout patterns with kernel functions tailored to unique process effects. Other statistical methods, interpolation methods, or regression analyses may also be used to achieve the same purpose. The above embodiments utilize metal layers and feature thicknesses for illustrative purposes and thus do not intend to limit the application of various embodiments of the present invention to metal layers and should not be limited as such.

Yet some other embodiments of the present invention use model developed from multiple processes that may represent primary and alternative foundry sources for a particular design. The models may be used to generate a distribution of thickness values that are combined with one or more requirements which are based upon the upper and lower threshold of feature sizes (such as metal thicknesses) to generate a location marker for the violation or recommend changes to the user based upon the violations of the aforementioned requirements. Another embodiment may combine models of pattern dependent process behavior with measured or characterized wafer level variability or statistical representations of random process shifts or drift.

In various embodiments of the present invention, the concurrent models comprise models for processes or techniques in integrated circuit fabrication, metrology, and image processing. Such integrated circuit fabrication processes or techniques may comprise, for example but not limited to, deposition processes such as physical vapor deposition (PVD), chemical vapor deposition (CVD), atomic layer deposition (ALD), electrochemical deposition or electro-plating (ECD), electroless plating or deposition, auto-catalytic plating or deposition, and molecular beam epitaxy (MBE), removal processes such as isotropic or anisotropic wet or dry etching, chemical mechanical polishing (CMP), or reflow processes, patterning processes such as lithography, modification of properties such as ion implantation, annealing, oxidation, UVP (ultraviolet light processing).

More specifically, lithography processes or techniques comprise microlithography, nanolithography, photolithography, electron beam lithography, maskless lithography, nanoimprint lithography, interference lithography, x-ray lithography, extreme ultraviolet lithography, or scanning probe lithography, or the plasma ashing processes. In some embodiments of the present invention, the concurrent models may also comprise models for the metrology processes or techniques. Metrology processes or techniques comprise transmission electron microscopy (TEM), scanning electron microscopy (SEM), transmission electron aberration-corrected microscopy, energy filtered TEM, or optical measurement techniques. Moreover, the image processing techniques or processes comprise, for example but not limited to, various resolution enhancement techniques such as ruled-based or model-based Optical Proximity Correction (OPC), Subresolution Assist Features (SRAF), Phase Shifting-Mask (PSM), and Off-Axis Illumination (OAI).

For each of the above methods, a corresponding system provides the means for implementing the above methods, and a corresponding computer program product comprises a computer-usable storage medium which has an executable code to execute the method. For each of the above methods the concurrent models may include characterizations of pattern-process interaction for one or more of the following processes: chemical mechanical polishing (CMP), wet and/or dry etching, electrochemical deposition (ECD) or electro-plating, physical vapor deposition (PVD), chemical vapor deposition (CVD), electrochemical deposition or electro-plating (ECD), electroless plating or deposition, auto-catalytic plating or deposition, epitaxy, molecular beam epitaxy (MBE), ion implantation, thermal processing, annealing, or reflow. For each of the above methods, the concurrent models may include a system of equations that describe the physical, chemical, and/or electrical characteristics that may impact the pattern and process interactions or an abstraction of such a model, for example a regression based fit of data or a table derived from the model or data from the model.

Figure 2:
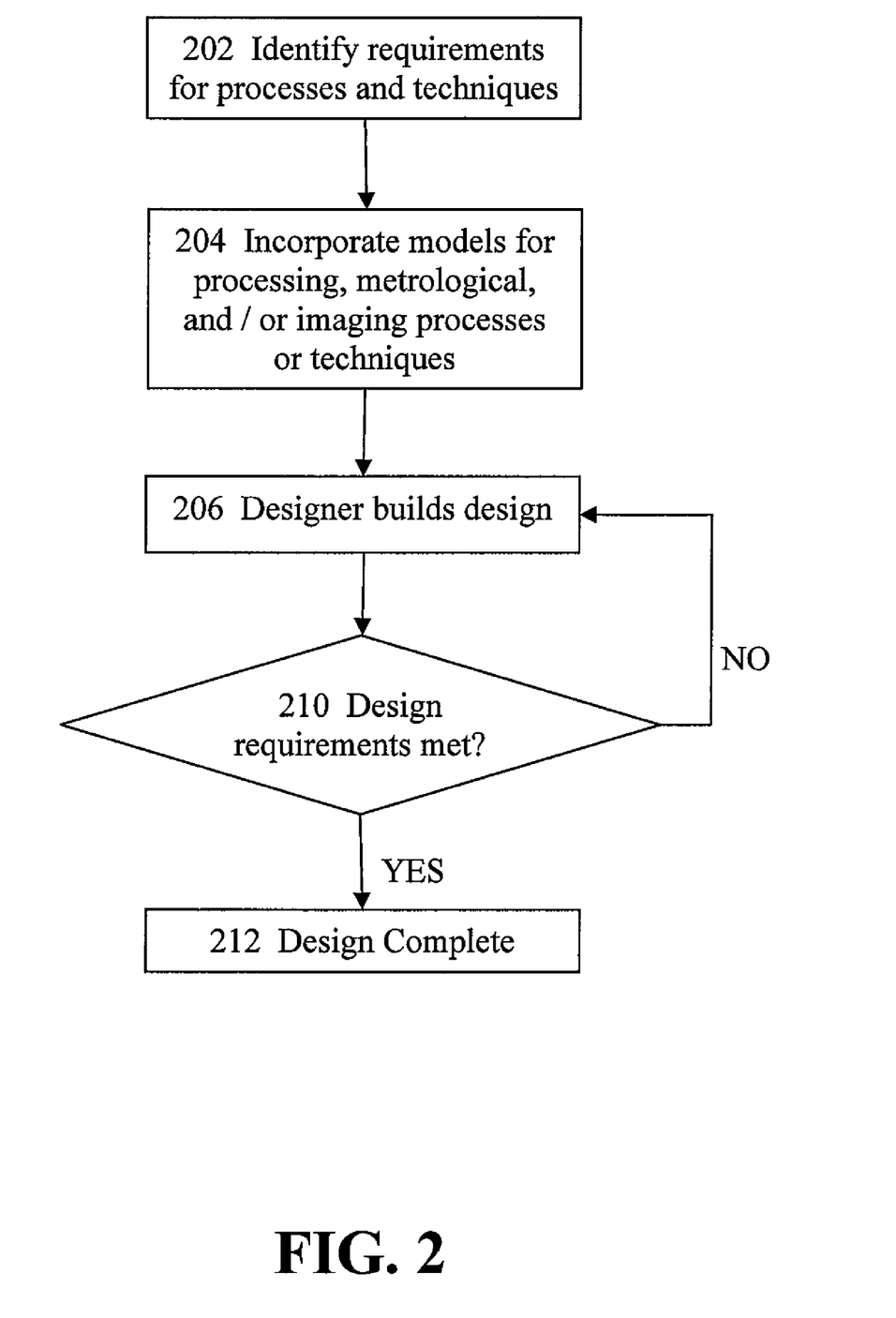
FIG. 2 illustrates a general flow of the methodology employing supplant design requirements for electronic designs.

FIG. 2 illustrates some embodiments of the invention. At 202, some embodiments define one or more design requirements. These design requirements may accommodate process-dependent geometric feature predictions, such as the prediction of feature thicknesses, and may also combine these estimates or predictions with pure layout driven geometric features such as the computed density or with circuit related specifications such as timing sensitive nets. Some of the one or more design requirements define an absolute numeric upper and/or a lower bound or a range of values for a characteristic of certain design features; for example, such design requirements may specify the wire thickness to be no thicker than 180 nm and or no thinner than 120 nm or the uniformity of the wire thickness to be within 60 nm, or the spacing to be no more than 20 nm and/or no less than 5 nm or the spacing variation is not be within 10 nm within an area in the design or across the entire chip area. In other embodiments of the present invention, different areas in the electronic design may different numeric bounds or ranges of values even for the same characteristic of a design feature. Yet in some other embodiments, design requirements may specify a relative range for a certain design feature; for example, such design requirements may specify the thickness gradient or flatness of a film to be within some distance for a given region size.

At 204, the process models are incorporated into the method to analyze and capture, for example, process specific impacts to the designs. The process models may include characterization of pattern-process interactions for one or more of the following processes: chemical mechanical polishing (CMP), wet and/or dry etching, electrochemical deposition (ECD) or electro-plating, chemical vapor deposition (CVD), physical vapor deposition (PVD), electrochemical deposition or electro-plating (ECD), electroless plating or deposition, auto-catalytic plating or deposition, epitaxy, molecular beam epitaxy (MBE), ion implantation, annealing, thermal processing, or reflow. At 206, the user or the designer utilizes the method or the system disclosed herein to check the assembled geometric features which constitute a particular design region or layout based upon the design requirements and the incorporated process models. This check may occur at the cell, macro, or full-chip level and may be done at one or more levels of the design.

At 210, the method or the system determines whether the design requirements are met. If the design requirements are met, the design is complete at step 212. If, on the other hand, some of the design requirements are not met, the method or the system goes back to step 206 where the design may be altered according to the result of the determination of whether the design requirements are satisfied. In some embodiments, the method or the system may, based upon the requirements that are not satisfied while taking the other requirements into account, recommend one or more changes to a characteristic of a circuit design feature to the designer or the user. In the foregoing embodiments, the step 204 may be optional and may be performed separately on either the same tool or on a separate tool.

Some other embodiments may be applied where only a portion of the final complete layout, for example one or more blocks or cells, is available. A context simulation method may be used to introduce likely geometric environments into the incomplete regions, for example structures with similar densities or line widths, or an environment with a geometric distribution based on prior designs. For processes with large pattern interaction ranges such as CMP, simulation of layout portions not available may be useful. More details about context simulation is described in U.S. patent application Ser. No. 11/768,851, entitled "METHOD AND SYSTEM FOR IMPLEMENTING CONTEXT SIMULATION" filed on Jun. 26, 2007 under which is incorporated herein by reference in its entirety.

Figure 3:
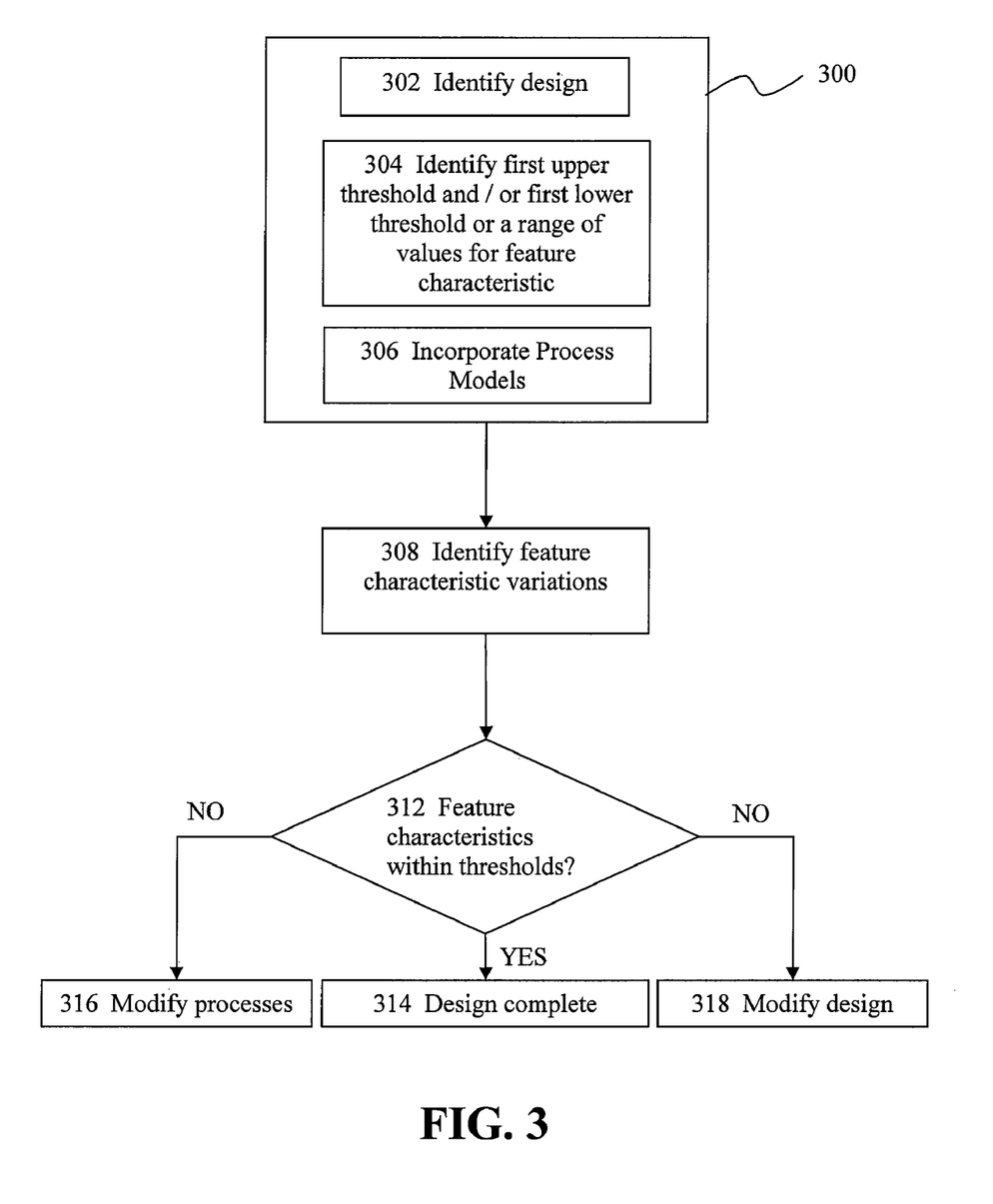
FIG. 3 illustrates some embodiments of a method for automated electronic designs with the supplant design requirements.

FIG. 3 illustrates some other embodiments of the present invention. At 300, these embodiments identify the IC design at 302, define a first upper and/or lower thresholds or one or more ranges of values for a feature characteristic at 304, and incorporate the pertinent processing, metrological, lithographic, and/or imaging processing (such as RET) models or techniques at 306. Note that there is no certain order as to which of the three actions, 302, 304, and 306, will be performed before the other steps. The method or the system of these embodiments of the present invention then identifies variations of the feature characteristic based upon the predetermined thresholds or range of values, the concurrent models, and the electronic design at 308. In some embodiments of the present invention, some of the processing, metrological, lithographic, and imaging processing (such as RET) models may be tool- or technique-dependent and thus may be constructed and/or calibrated by using the information obtained from a patterned wafer which is actually processed by the specific tool or technique or from other sources of limited fidelity such as a simple analytic model, empirical formulae or models, formulae or models with interpolation or extrapolation of information or data, or other approximations. In other embodiments of the present invention, such processing, metrological, lithographic, and imaging processing (such as RET) models may be generically modeled.

At 312, the method or the system of these embodiments of the present invention checks to determine whether the feature characteristics are within the predetermined thresholds or ranges of values. If the feature characteristics are within such thresholds or ranges of values, the design is complete at 314. On the other hand, if some of the feature characteristics are outside of the predetermined threshold(s) or range(s) of values, some embodiments of the present invention may modify the electronic design at 318, while some other embodiments of the present invention may modify the processes to meet the requirements for the feature characteristic based upon the predetermined thresholds or ranges of values. In the foregoing embodiments, the steps 304 and 306 are optional and, all the steps may be performed on either the same tool or on one or more separate tools.

For example, in some embodiments of the present invention, the method or the system may, upon the finding of one or more violations of the requirements or rules, resize or reposition a characteristic of a feature or the feature itself and determines whether the resized or repositioned characteristic of a feature or the feature itself would result in the satisfaction of the requirements of the predetermined threshold(s) or range(s) of values. As another example, in some other embodiments of the present invention, the method or the system may determine a new set of parameters for the incorporated processing, metrological, lithographic, and/or imaging processing (such as RET) processes or techniques while the electronic design remains unchanged and re-determines whether the unchanged electronic design meets the requirements of threshold(s) or range(s) of values under the processing, metrological, lithographic, and/or imaging processing (such as RET) processes or techniques with the new set of parameters. Note that some of the processing, metrological, lithographic, and/or imaging process (such as RET) processes or techniques may be tool- or technique-dependent and thus may be constructed and/or calibrated by the information obtained from a patterned test wafer which is actually processed by the aforementioned incorporated processes or techniques or from other sources of limited fidelity such as a simple analytic model, empirical formulae or models, formulae or models with interpolation or extrapolation of information or data, or other approximations.

In some other embodiments of the present invention, a user may utilize the method or system disclosed herein to analyze the models and the electronic design to predict characteristics, such as thicknesses, of various features of the electronic design and then modify the characteristics of various features so as to meet the requirement. In some other embodiments, the method or the system may define a cost function or a performance metric of the electronic design and seeks to reduce or minimize the cost function or to optimize the performance metric.

Figure 4:
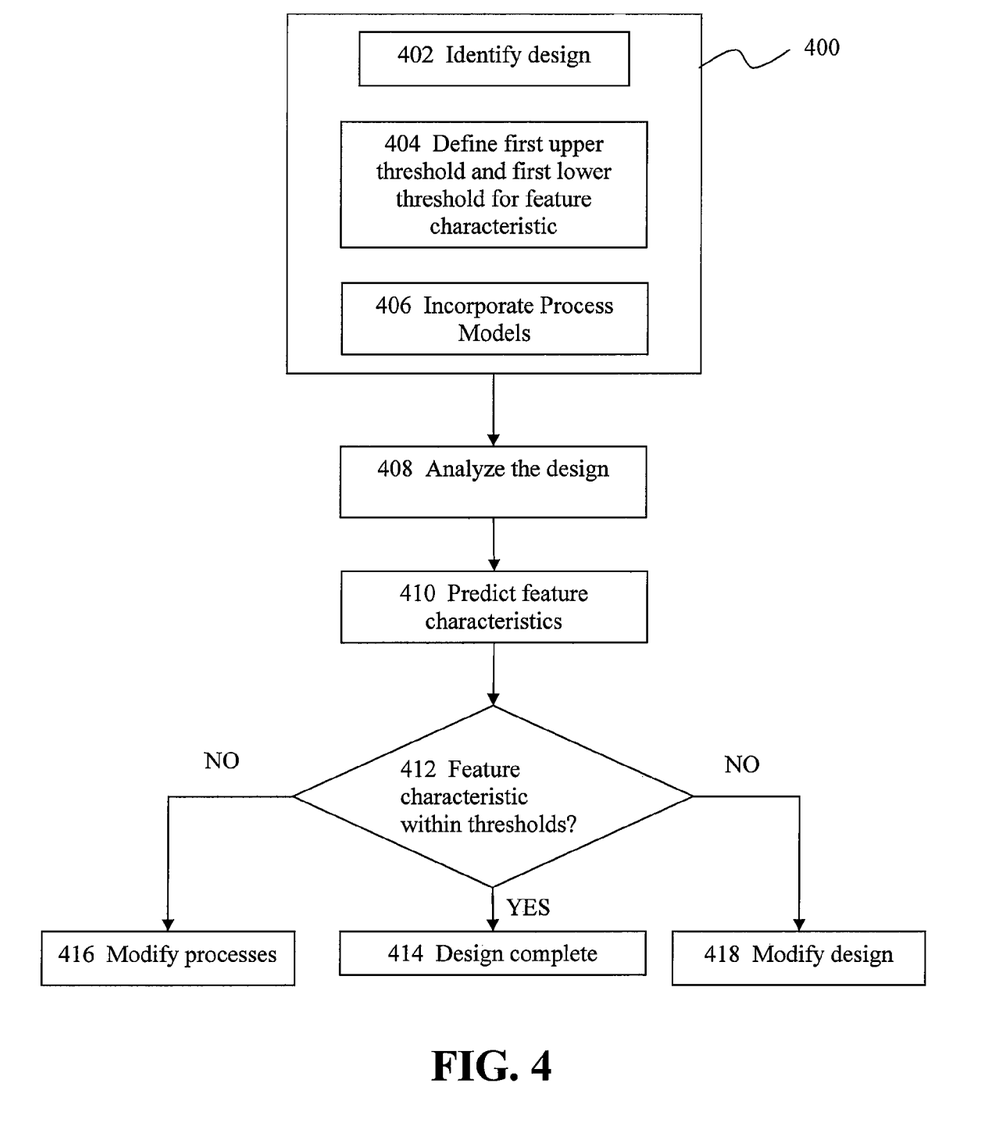
FIG. 4 illustrates some embodiments of an electronic design tool incorporating the supplant design requirements.

FIG. 4 illustrate some embodiments of the present invention which analyze the electronic circuit design, predict feature characteristics, and determine whether the feature characteristics fall within certain predefined thresholds or ranges of values. In 400, the method or the system of these embodiments of the present invention identifies the electronic design at 402, defines an upper and/or a lower threshold or a range of value for a design feature characteristic at 404, and incorporates the pertinent concurrent models at 406. Note that there is no certain order as to which of the three actions will be performed before the other steps. At 408, the method or the system of these embodiments of the present invention analyzes the electronic design. Where one or more processing models are incorporated into the method, the method or the system of these embodiments of the present invention analyzes the electronic design based in part upon the one or more processing models.

At 410, the method or the system of these embodiments of the present invention predicts the feature characteristics of the electronic design. The method or the system may predict characteristics of various features of the electronic circuit design based upon the electronic design alone or in conjunction with the processing, metrological, and/or lithographic models. The method or the system may then determine whether a feature characteristic is within the predetermined threshold(s) or range(s) of values requirements at 412. If the feature characteristics are within such threshold(s) or range(s) of values requirements, the design is complete at 414. On the other hand, if some of the feature characteristics are outside of the thresholds, some embodiments of the present invention modify the design at 418, while some other embodiments of the present invention modify the processing, metrological, and/or imaging processing processes or techniques to meet the threshold(s) or range(s) of values requirement for the feature characteristic at 416.

In some other embodiments of the present invention, the method or the system evaluates the impact of the violations of the requirements for the threshold(s) or range(s) of values upon various aspects of the electronic design and determines whether or not to modify the electronic design or the processing, metrological, and/or lithographic processes. In yet some other embodiments of the present invention, the user or the designer may determine whether or not to make such modifications to the electronic design or the processing, metrological, and/or lithographic processes. In the foregoing embodiments, the steps 404 and 406 are optional and, all the steps may be performed on either the same tool or on one or more separate tools. One example of this is where model predicted topography results in lithography induced width variation and as such, modifications may be made to the contour of the shape to be printed or modifications may be made to the lithography process if a sufficient number of violations occur.

Some other embodiments of the present invention define one or more requirements which do not specify the upper and/or lower thresholds of feature characteristic, such as metal thicknesses, and use one or more of these requirements to evaluate which features of the electronic design are to be modified and which features may be manufacturable. Such one or more requirements may comprise, for example but not limited to, a relative range of values or an absolute range of values within which design features are considered good. For example, such design requirements may specify the flatness of the film to be within 10 nm.

Figure 5:
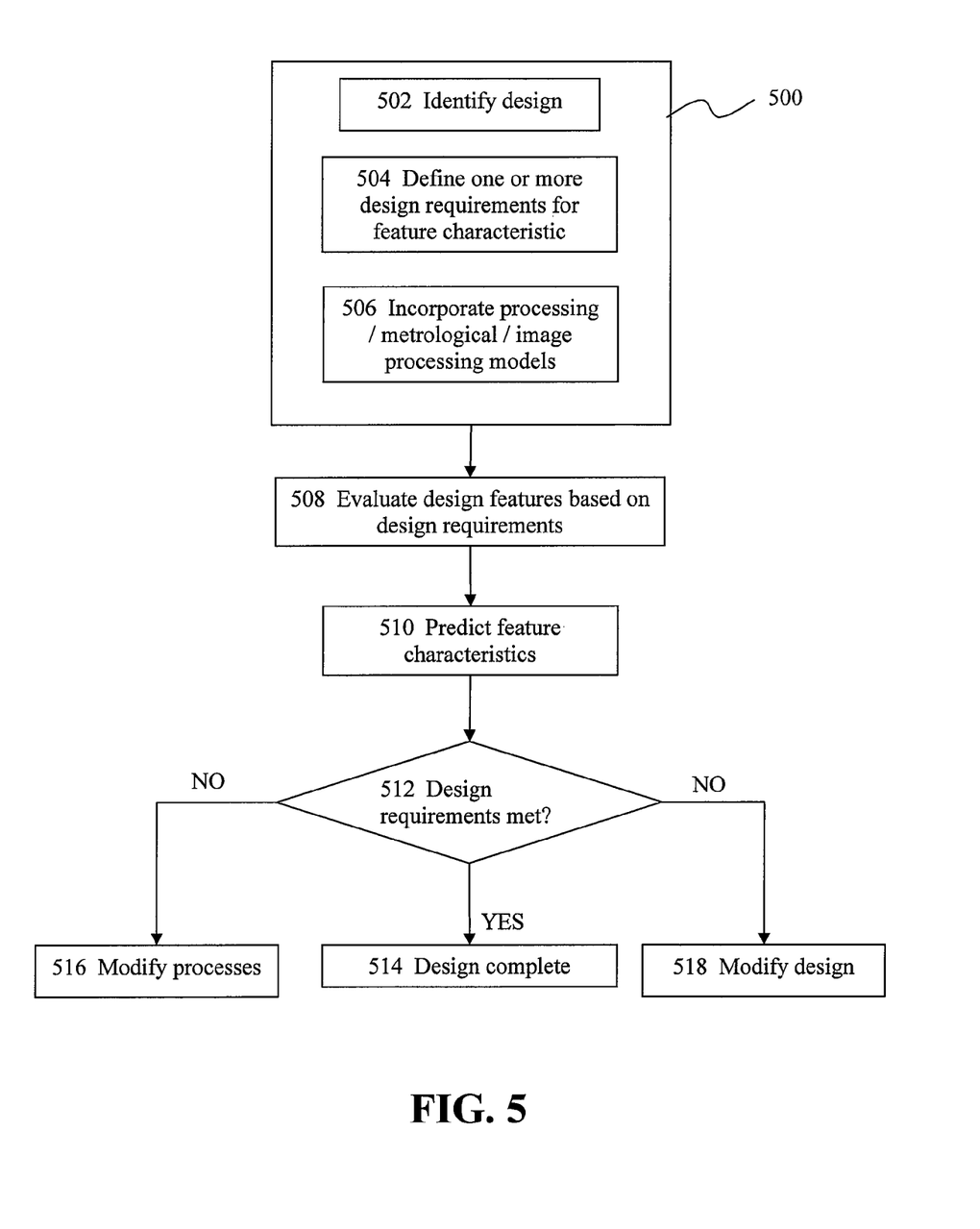
FIG. 5 illustrates some embodiments of an electronic design tool incorporating a different set of the supplant design requirements.

FIG. 5 illustrate some embodiments which analyze the IC design, predict feature characteristics, and determine whether the feature characteristics fall within certain predefined thresholds. In 500, the method or the system of some embodiments of the present invention identifies the design at 502, define one or more design requirements for a design feature characteristic at 504, and incorporate the pertinent processing/metrological/lithographic models at 506. Here, the one or more design requirements do not specify an upper and/or a lower threshold or any ranges of values for the design feature characteristic. Note that there is no certain order as to which of the three steps, 502, 504, and 506, will be performed before the other steps.

At 508, the method or the system of some embodiments of the present invention evaluates the design features based upon the design requirements, the processing, metrological, and/or lithographic models, and the electronic design. At 510, the method or the system of some embodiments of the present invention predicts the feature characteristics. In some other embodiments of the present invention, the method or the system predicts the feature characteristics based upon the electronic design and the incorporated processing, metrological, lithographic, and/or imaging process (such as RET) models. In some embodiments of the present invention, some of the processing, metrological, lithographic, and imaging process (such as RET) models is tool or technique dependent and may thus be constructed and/or calibrated by using the information obtained from a patterned wafer which is actually processed by the specific tool or technique or from other sources of limited fidelity such as a simple analytic model, empirical formulae or models, formulae or models with interpolation or extrapolation of information or data, or other approximations.

At 512, the method or the system of some embodiments of the present invention determines whether the design feature characteristics meet the one or more requirements. If the feature characteristics are within such requirements of threshold(s) or range of values, the design is complete at 514. On the other hand, if some of the feature characteristics do not meet the requirements of the threshold(s) or range(s) of values, some embodiments may modify the electronic design at 518, while some other embodiments may modify the processing, metrological, lithographic, and/or imaging processing (such as RET) processes or techniques so as to meet the requirements for the feature characteristic at 516.

In some other embodiments of the present invention, the method or the system may evaluate the impact of the one or more violation(s) of the requirements on the performance of the electronic design. For example, the method or the system may, in some embodiments of the present invention, evaluates the impact of one or more violations of the requirements on the timing or electrical performance of the electronic design. Yet in some other embodiments of the present invention, the method or the system may modify the design or the processing, metrological, lithographic, and/or imaging processing (such as RET) processes or techniques so as to reduce or minimize a cost function or to optimize a performance metric. For example, the method or the system may, in some embodiments of the present invention, may evaluate some or all of the violations of the requirements to determine whether and how to modify the electronic design or the processing, metrological, lithographic, and/or imaging processing (such as RET) processes or techniques so as to reduce or minimize timing violations. In the foregoing embodiments, the steps 504 and 506 are optional and, all the steps may be performed on either the same tool or on one or more separate tools.

Some other embodiments of the present invention provide an electronic design automation tool that takes an electronic design layout, one or more models for the processing, metrological, lithographic, and/or imaging processing (such as RET) processes or techniques, and one or more requirements which are based upon the upper and lower thresholds of metal thicknesses to show to the users where, within the electronic design, these requirements are not satisfied.

Figure 6:
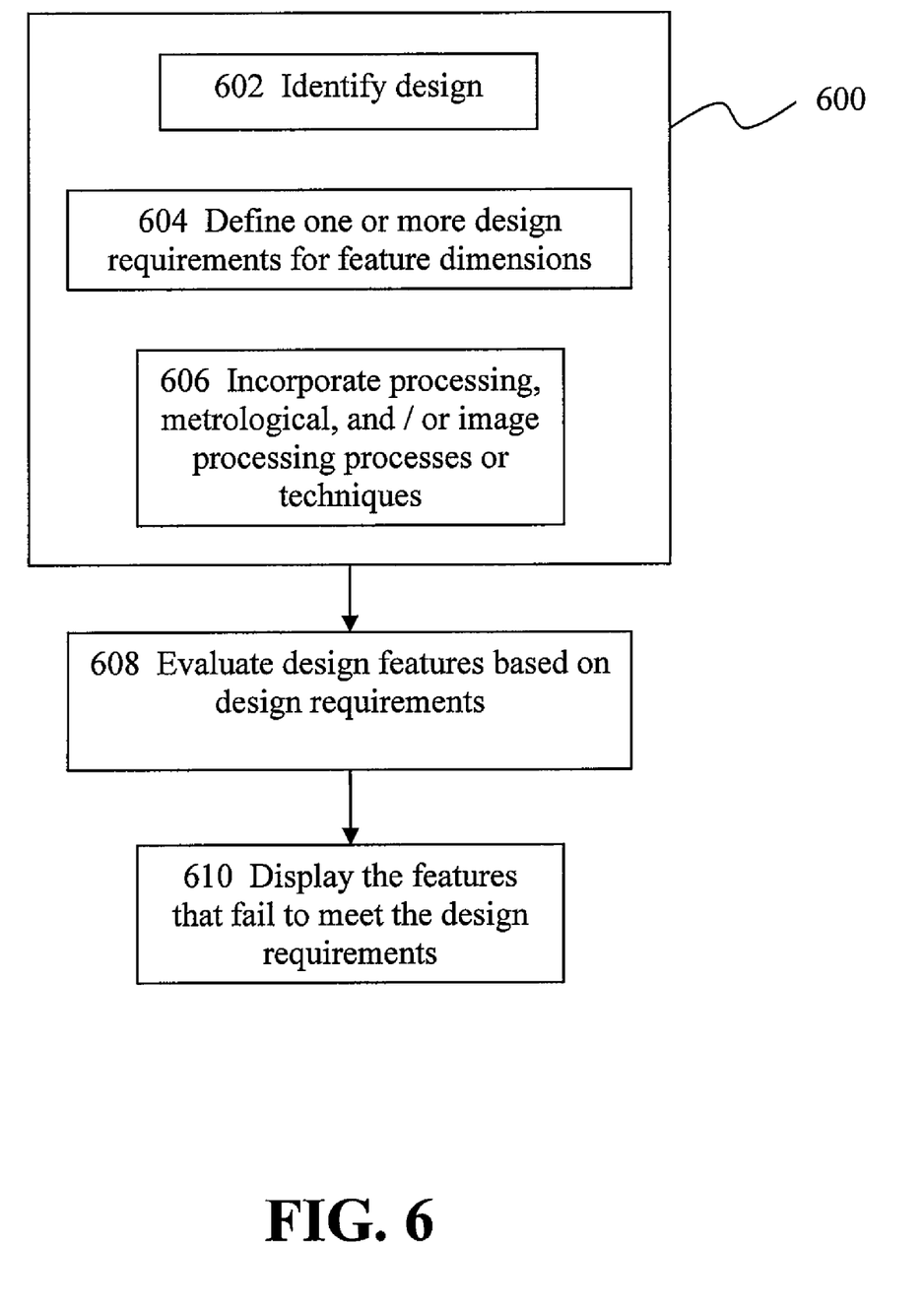
FIG. 6 illustrates some embodiments of an electronic design tool incorporating the supplant design requirements.

FIG. 6 illustrates some other embodiments of the invention which evaluate the design features based on the predetermined requirements and display the design features/areas within the design that fail to meet the design requirements. In 600, the method of these embodiments identify the design at 602, define one or more design requirements for a design feature characteristic at 604, and incorporate the pertinent models for the processing, metrological, lithographic, and/or imaging processing (such as RET) processes or techniques at 606. Here, the one or more design requirements may nor may not specify an upper and/or a lower threshold or a range of values for the design feature characteristic. Note that there is no certain order as to which of the three steps will be performed before the other steps. At 608, the method or the system of some embodiments of the present invention evaluates the feature characteristics based upon the above requirements. At 610, the method or the system further displays to the designers or users the design features, a characteristic of a design feature, and/or areas that fail to meet the requirements. In the foregoing embodiments, the steps 604 and 606 are optional and, all the steps may be performed on either the same tool or on one or more separate tools.

Some other embodiments of the present invention provide an electronic design automation tool which takes a design layout, one or more models for the processing, metrological, lithographic, and/or imaging processing (such as RET) processes or techniques, and one or more requirements which are based upon the upper and/or lower threshold of a feature characteristic, such as metal thicknesses, to recommend changes to the user based upon the violations of the aforementioned requirements.

Figure 7:
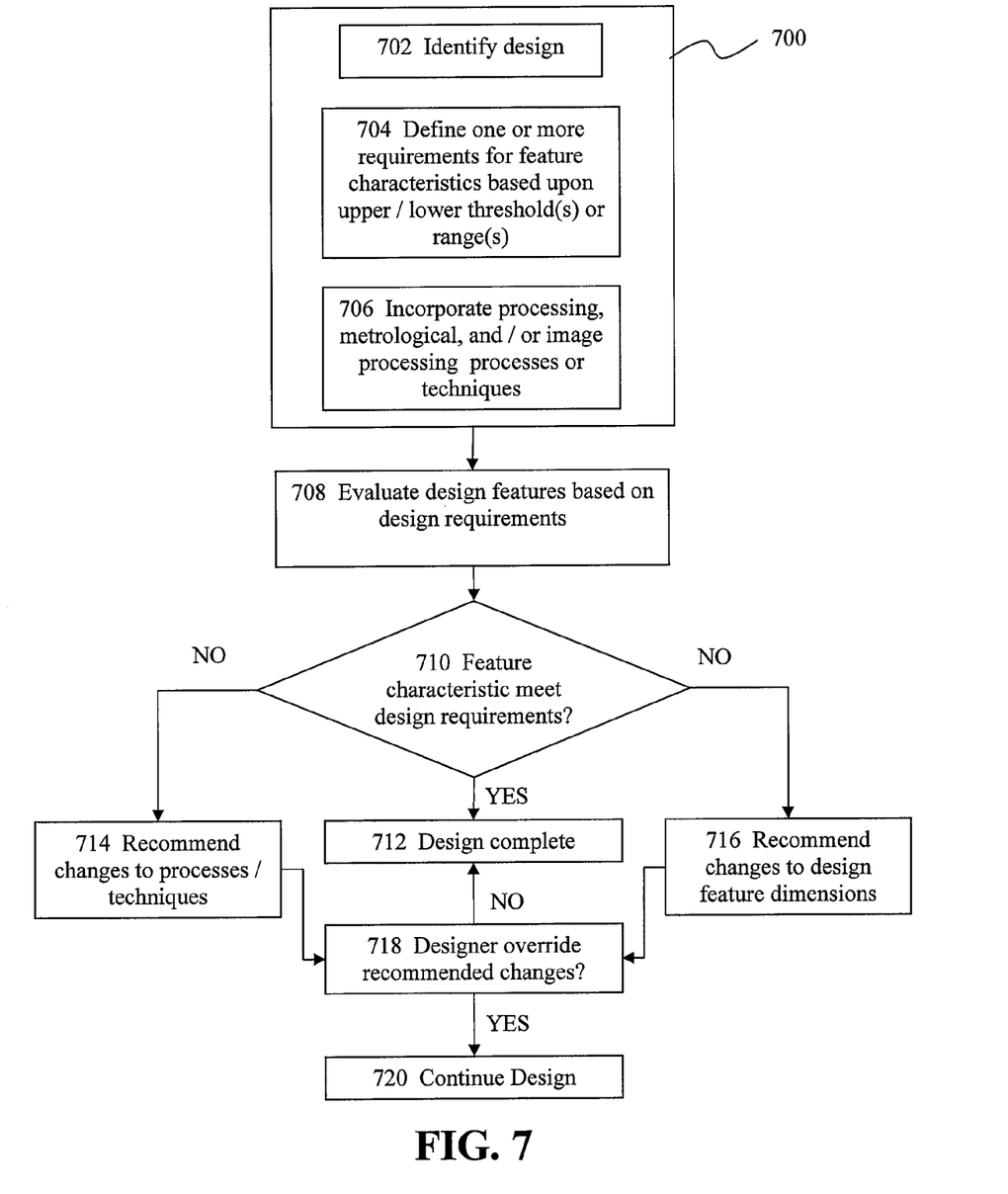
FIG. 7 illustrates some embodiments of an electronic design tool incorporating the supplant design requirements.

FIG. 7 illustrates some other embodiments of the invention which evaluate the design features or characteristics of the design features based on the predetermined requirements and display the design features, characteristics of design features, and/or areas within the design which fail to meet the predetermined requirements. In 700, the method or the system of some embodiments of the present invention identifies the design at 702, defines one or more requirements for a design feature characteristic at 704, and incorporates the pertinent models for the processing, metrological, lithographic, and/or imaging processing (such as RET) processes or techniques at 706. Here, the one or more requirements may or may not specify an upper and/or a lower threshold or a range of values for the design feature characteristic. Note that there is no certain order as to which of the three steps will be performed before the other steps. Also note that some of the processing, metrological, lithographic, and imaging processing (such as RET) models may be tool- or technique-dependent and thus may be constructed and/or calibrated by using the information obtained from a patterned wafer which is actually processed by the specific tool or technique or from other sources of limited fidelity such as a simple analytic model, empirical formulae or models, formulae or models with interpolation or extrapolation of information or data, or other approximations.

At 708, the methods of these embodiments evaluate the design features based upon the above design requirements. At 710, the method or the system of various embodiments of the present invention determines whether the design features or feature characteristics meet the requirements. If the design features and/or the characteristics of design features meet such design requirements, the design is complete at 712. On the other hand, if some of the design features or some of the characteristics of design features fail to meet the requirements, some embodiments of the present invention recommend changes to the design features or characteristics of design features at 716, while some other embodiments recommend changes to the processing, metrological, lithographic, and/or imaging processing (such as RET) processes or techniques at 714.

Optionally, after recommending one or more changes to the processes, techniques, or the electronic design itself, the designer or user determine whether or not to override such recommended changes by the method or the system at 718. If the user or designer determines not to override such recommended changes, the method or the system accepts such recommended changes and completes the electronic design at 712. On the other hand, where the user or the designer decides to override such recommended changes the method or the system may either ask for and take the user's or designer's input to proceed with the electronic design at 720. Alternatively, where the user or the designer decides to override such recommended changes the method or the system may further ask for the user's or designer's input and recommend to the user or designer another set of changes to the processes or techniques or the electronic design itself at 720. In the foregoing embodiments, the steps 704 and 706 are optional and, all the steps may be performed on either the same tool or on one or more separate tools.

Some embodiments of the present invention translate the information about the concurrent models and/or the design elements into a separate set of requirements without unnecessarily disclosing any specifics of such processing, metrological, lithographic, and/or imaging processing (such as RET) processes or techniques and/or the design elements to third parties. Such embodiments are particularly useful in protecting the ownership of intellectual property and rights therein. For example, the semiconductor foundries may not wish to disclose such information to IC design houses; the processing equipment manufacturers may not wish to disclose the true capabilities of their processing equipment to other parties; and IP core owners may wish to grant only the right to use without disclosing the details of such IP cores to the licensees or users.

Some other embodiments further obtain the information about the fabricated features of the design and use such information to further calibrate the concurrent models as well as the modifications to the design itself or the fabrication processes so as to improve the accuracy and effectiveness of the above methods.

Some other embodiments further utilize systems utilizing parallel computing architecture to achieve the purpose. Some other embodiments also store the information and/or data so acquired in a data structure or a database for subsequent retrieval as well as use. Some other embodiments may also construct a matching table for the foundry-imposed design requirements and their corresponding true design requirements. For example, an embodiment may, after the completion of the above methods, construct a matching table for the foundry-imposed metal densities design requirements and the corresponding thickness requirements.

In the foregoing specification, various embodiments of the invention have been described with reference to specific embodiments thereof. It will, however, be evident that various modifications and changes may be made thereto without departing from the broader spirit and scope of various embodiments of the invention. For example, the above-described process flows are described with reference to a particular ordering of process actions. However, the ordering of many of the described process actions may be changed without affecting the scope or operation of various embodiments of the invention. The specification and drawings are, accordingly, to be regarded in an illustrative rather than restrictive sense.

System Architecture Overview

Figure 8:
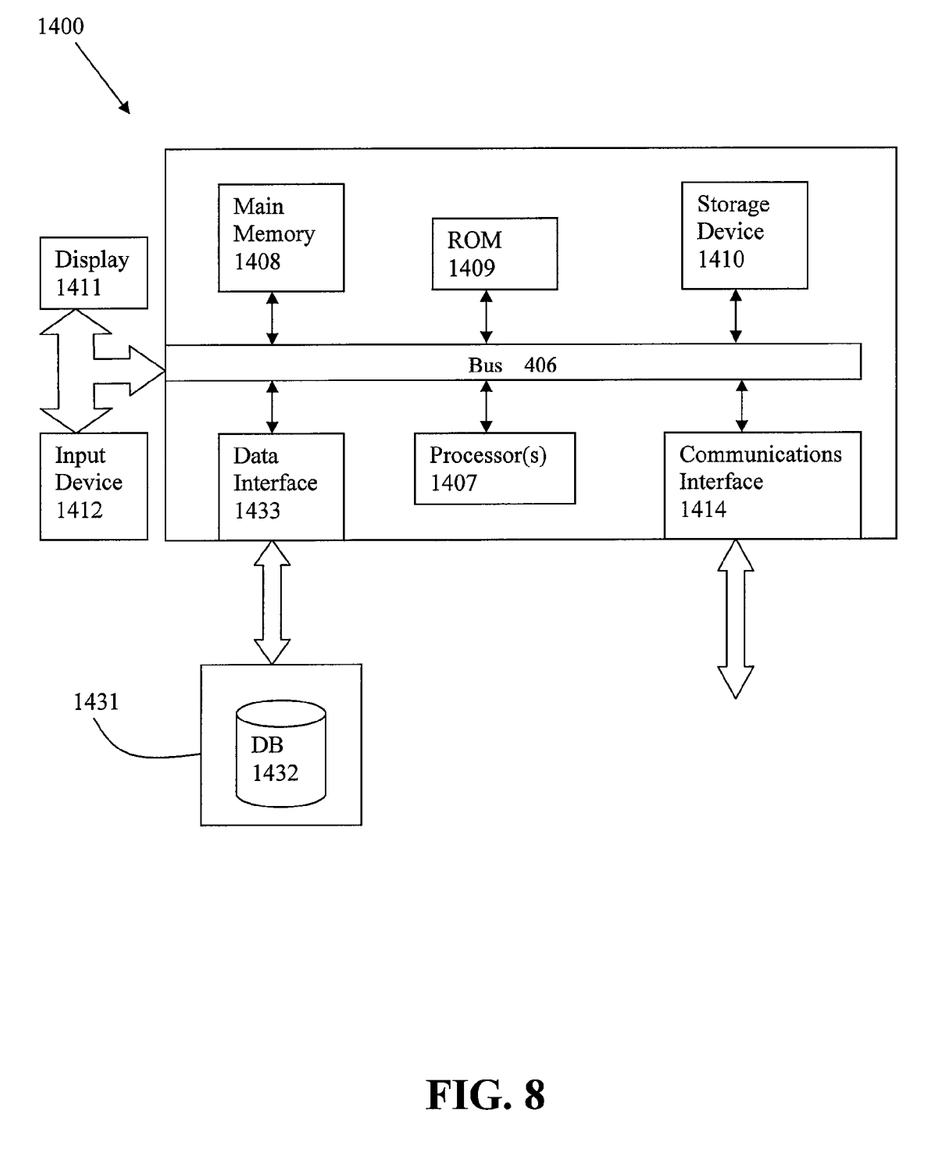
FIG. 8 illustrates an example system with which the invention may be employed.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown.)

According to one embodiment of the invention, computer system 1400 performs specific operations by processor(s) 1407 executing one or more sequences of one or more instructions contained in system memory 1408. Such instructions may be read into system memory 1408 from another computer readable/usable medium, such as static storage device 1409 or storage devices such as hard disk drives 1410. In alternative embodiments, hard-wired circuitry may be used in place of or in combination with software instructions to implement various embodiments of the invention. Thus, embodiments of the invention are not limited to any specific combination of hardware circuitry and/or software. In one embodiment, the term "logic" shall mean any combination of software or hardware that is used to implement all or part of various embodiments of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive(s) 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice an embodiment of the invention is performed by a single computer system 1400. According to other embodiments of the invention, two or more computer systems 1400 coupled by communication link 1415 (e.g., LAN, PTSN, or wireless network) may perform the sequence of instructions required to practice an embodiment of the invention in coordination with one another.

Computer system 1400 may transmit and receive messages, data, and instructions, including program, i.e., application code, through communication link 1415 and communication interface 1414. Received program code may be executed by processor(s) 1407 as it is received, and/or stored in disk drive(s) 1410, or other non-volatile storage for later execution. Computer system 1400 may also interact with a database system 1432 via a data interface 1433 where the computer system 1400 may store and retrieve information or data of the electronic design into and from the database system.

In the foregoing specification, various embodiments of the invention has been described with reference to specific embodiments thereof. It will, however, be evident that various modifications and changes may be made thereto without departing from the broader spirit and scope of various embodiments of the invention. For example, the above-described process flows are described with reference to a particular ordering of process actions. However, the ordering of many of the described process actions may be changed without affecting the scope or operation of various embodiments of the invention. The specification and drawings are, accordingly, to be regarded in an illustrative rather than restrictive sense.

What is claimed is:

1. A machine-implemented method for supplanting foundry imposed design rules in an electronic design, comprising:
using a computer configured for performing:
identifying an electronic design of an electronic circuit, in which the electronic design comprises an electronic design feature;
determining a new design rule to supplant one or more of the foundry imposed design rules by identifying a direct requirement for a characteristic of the electronic design feature, in which
the characteristic comprises a geometric, physical, chemical, or electrical attribute of the electronic design feature, and
the new design rule incorporates the direct requirement for the characteristic, and the one or more of the foundry imposed design rules incorporates an indirect requirement for a different characteristic of the electronic design feature;
identifying a model for a fabrication, metrology, or image processing process;
determining whether the new design rule is satisfied by the electronic design feature to be manufactured based at least in part upon the model for the fabrication, metrology, or image processing process; and
displaying a result of the determining whether the rule is satisfied on a display apparatus or storing the result in a tangible machine accessible storage medium.

2. The machine-implemented method of claim 1, in which the characteristic further comprises a geometric attribute coupled with one or more physical, chemical, or electrical attributes of the electronic design feature.

3. The machine-implemented method of claim 1, in which the determining whether the new design rule is satisfied by the electronic design feature to be manufactured comprises:
identifying a first upper threshold, a first lower threshold, or a range of permissible values for the characteristic of the electronic design feature; and
determining whether the characteristic of the electronic design feature meets a first requirement defined by the first upper threshold, the first lower threshold, or a range of permissible values for the characteristic of the electronic design feature.

4. The machine-implemented method of claim 1, further comprising:
modifying the fabrication, metrology, or image processing process upon which the model was determined or modifying the electronic design to satisfy the rule, wherein the rule is determined not to be satisfied before modification.

5. The machine-implemented method of claim 1, further comprising:
predicting the characteristic of the electronic design feature to be manufactured by the fabrication, metrology, or image processing process based at least in part upon the model for the fabrication, metrology, or image processing process.

6. The machine-implemented method of claim 1, in which the fabrication process comprises physical vapor deposition (PVD), chemical vapor deposition (CVD), electrochemical deposition (ECD), electroplating, electroless plating or deposition, auto-catalytic plating or deposition, molecular beam epitaxy (MBE), atomic layer deposition (ALD), ion implantation, thermal processing, oxidation, annealing, wet or dry etching, chemical mechanical polishing (CMP), reflow, a property modification process, or a patterning process.

7. The machine-implemented method of claim 1, further comprising:
determining the model for the fabrication, metrology, or image processing process.

8. The machine-implemented method of claim 7, further comprising:
calibrating the model for a fabrication, metrology, or image processing process with information of one or more electronic design features obtained from a patterned test wafer or from a source with limited fidelity.

9. The machine-implemented method of claim 7, further comprising:
directly simulating a measurement result of the fabrication, metrology, or image processing process; and
calibrating a result of the directly simulating a measurement result of the fabrication, metrology, or image processing process with information obtained from a patterned test wafer or from a source with limited fidelity.

10. The machine-implemented method of claim 9, wherein the requirement does not specify a threshold value for the characteristic.

11. The machine-implemented method of claim 1, in which the metrology process comprises transmission electron microscopy (TEM), scanning electron microscopy (SEM), transmission electron aberration-corrected microscopy, energy filtered TEM, or an optical technique.

12. The machine-implemented method of claim 1, in which the fabrication process comprises a patterning process which comprises microlithography, nanolithography, photolithography, electron beam lithography, maskless lithography, nanoimprint lithography, interference lithography, x-ray lithography, extreme ultraviolet lithography, or scanning probe lithography.

13. The machine-implemented method of claim 1, further comprising:
recommending one or more changes to the electronic design or to the fabrication, metrology, or image processing process upon which the model was determined, where the rule is determined not to be satisfied.

14. The machine-implemented method of claim 13, further comprising:
overriding the one or more changes to the electronic design or to the fabrication, metrology, or image processing process upon which the model was determined, where the rule is determined not to be satisfied.

15. The machine-implemented method of claim 1, in which the image processing process comprises a resolution enhancement technique (RET).

16. The machine-implemented method of claim 3 in which the first upper threshold, the first lower threshold, or the range of permissible values is compared with a distribution or relevant statistical representation of a potential value generated by the model for the fabrication, metrology, or image processing process.

17. The machine-implemented method of claim 16, in which the potential value generated by the model comprises a measurement of variability from at least one of the fabrication, metrology, or image processing process.

18. The machine-implemented method of claim 1, in which part of the electronic design is generated by a context simulation method.

19. The machine-implemented method of claim 1, further comprising:
combining the model for a fabrication, metrology, or image processing process with statistical variability measured from or produced by an additional model for the electronic circuit to produce a distribution of values related to the electronic design feature.

20. A system for supplanting planarization design rules in electronic circuit design, comprising:
means for identifying an electronic design comprising an electronic design feature;
means for determining a new design rule to supplant one or more of the foundry imposed design rules by identifying a direct requirement for a characteristic of the electronic design feature, in which
the characteristic comprises a geometric, physical, chemical, or electrical attribute of the electronic design feature, and
the new design rule incorporates the direct requirement for the characteristic, and the one or more of the foundry imposed design rules incorporates an indirect requirement for a different characteristic of the electronic design feature;
means for incorporating a model for a fabrication, metrology, or image processing process;
at least one computer processor configured for determining whether the new design rule is satisfied by the electronic design feature to be manufactured based at least in part upon the model for the fabrication, metrology, or image processing process; and
a display apparatus configured for displaying a result of the determining whether the new design rule is satisfied or a computer readable storage medium or a computer storage device configured for storing the result.

21. The system of claim 20, in which the at least one computer processor configured for determining whether the rule is satisfied by the electronic design feature to be manufactured is further configured for:
identifying a first upper threshold, a first lower threshold, or a range of permissible values for the characteristic of the electronic design feature; and
determining whether the characteristic of the electronic design feature meets a requirement defined by the first upper threshold, the first lower threshold, or a range of permissible values for the characteristic of the electronic design feature.

22. The system of claim 20, further comprising:
means for modifying the fabrication, metrology, or image processing process upon which the model was determined or means for modifying the electronic design to satisfy the rule, where the rule is determined not to be satisfied before modification.

23. The system of claim 20, further comprising:
means for determining the model for a fabrication, metrology, or image processing process.

24. A computer program product comprising a computer-usable storage medium having executable code which, when executed by at least one computer processor, causes the at least one computer processor to execute a process for supplanting planarization design rules in electronic circuit design, the process comprising:
using a computer system configured for performing:
identifying an electronic design comprising an electronic design feature;
determining a new design rule to supplant one or more of the foundry imposed design rules by identifying a direct requirement for a characteristic of the electronic design feature, in which
the characteristic comprises a geometric, physical, chemical, or electrical attribute of the electronic design feature, and
the new design rule incorporates the direct requirement for the characteristic, and the one or more of the foundry imposed design rules incorporates an indirect requirement for a different characteristic of the electronic design feature;
identifying a model for a fabrication, metrology, or image processing process;
determining whether the new design rule is satisfied by the electronic design feature to be manufactured based at least in part upon the model for the fabrication, metrology, or image processing process; and
displaying a result of the determining whether the new design rule is satisfied on a display apparatus or storing the result in a computer readable storage medium or a computer storage device.

25. The computer program product of claim 24, in which the act of determining whether the new design rule is satisfied by the electronic design feature to be manufactured comprises:
identifying a first upper threshold, a first lower threshold, or a range of permissible values for the characteristic of the electronic design feature; and
determining whether the characteristic of the electronic design feature meets a first requirement defined by the first upper threshold, the first lower threshold, or a range of permissible values for the characteristic of the electronic design feature.

26. The machine implemented method of claim 1, wherein the characteristic comprises thickness of the electronic design feature.

27. The system of claim 20, in which the at least one computer processor is further configured for:
predicting the characteristic of the electronic design feature to be manufactured by the fabrication, metrology, or image processing process based at least in part upon the model for the fabrication, metrology, or image processing process.

28. The system of claim 23, in which the at least one computer processor is further configured for:
calibrating the model for a fabrication, metrology, or image processing process with information of one or more electronic design features obtained from a patterned test wafer or from a source with limited fidelity;
directly simulating a measurement result of the fabrication, metrology, or image processing process; and
calibrating a result of the directly simulating a measurement result of the fabrication, metrology, or image processing process with information obtained from a patterned test wafer or from a source with limited fidelity.

29. The system of claim 20, in which the at least one computer processor is further configured for:
  recommending one or more changes to the electronic design or to the fabrication, metrology, or image processing process upon which the model was determined, where the rule is determined not to be satisfied; and
  overriding the one or more changes to the electronic design or to the fabrication, metrology, or image processing process upon which the model was determined, where the rule is determined not to be satisfied.

30. The computer program product of claim 24, the process further comprising:
  modifying the fabrication, metrology, or image processing process upon which the . model was determined or modifying the electronic design to satisfy the rule, wherein the rule is determined not to be satisfied before modification; and
  predicting the characteristic of the electronic design feature to be manufactured by the fabrication, metrology, or image processing process based at least in part upon the model for the fabrication, metrology, or image processing process.

31. The computer program product of claim 24, the process further comprising:
  determining the model for the fabrication, metrology, or image processing process;
  calibrating the model for a fabrication, metrology, or image processing process with information of one or more electronic design features obtained from a patterned test wafer or from a source with limited fidelity;
  directly simulating a measurement result of the fabrication, metrology, or image processing process; and
  calibrating a result of the directly simulating a measurement result of the fabrication, metrology, or image processing process with information obtained from a patterned test wafer or from a source with limited fidelity.

32. The computer program product of claim 24, the process further comprising:
  recommending one or more changes to the electronic design or to the fabrication, metrology, or image processing process upon which the model was determined, where the rule is determined not to be satisfied; and
  overriding the one or more changes to the electronic design or to the fabrication, metrology, or image processing process upon which the model was determined, where the rule is determined not to be satisfied.

* * * * *